US009281168B2

(12) United States Patent
Mudivarthi et al.

(10) Patent No.: US 9,281,168 B2
(45) Date of Patent: Mar. 8, 2016

(54) REDUCING SWITCHING VARIATION IN MAGNETORESISTIVE DEVICES

(71) Applicant: Everspin Technologies, Inc., Chandler, AZ (US)

(72) Inventors: Chaitanya Mudivarthi, Chandler, AZ (US); Jason Allen Janesky, Gilbert, AZ (US); Jijun Sun, Chandler, AZ (US); Frederick Bennett Mancoff, Chandler, AZ (US); Sanjeev Aggarwal, Scottsdale, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 14/298,085

(22) Filed: Jun. 6, 2014

(65) Prior Publication Data

US 2015/0357560 A1 Dec. 10, 2015

(51) Int. Cl.
*H01L 27/11* (2006.01)
*H01L 27/22* (2006.01)
*H01J 43/12* (2006.01)

(52) U.S. Cl.
CPC ..................................... *H01J 43/12* (2013.01)

(58) Field of Classification Search
CPC ....... H01L 27/222; H01L 27/11; H01L 29/82; H01L 27/1159; G11C 11/16; G11C 11/5607; G11C 2211/5615; H01F 10/32
See application file for complete search history.

(56) References Cited

U.S. PATENT DOCUMENTS 4,396,437 A * 8/1983 Kwok ................. H01L 21/3245
257/E21.326
5,589,010 A * 12/1996 Gay .......................... H01F 1/26
148/306

(Continued)

*Primary Examiner* — Evan Pert
*Assistant Examiner* — Gustavo Ramallo

(57) ABSTRACT

The magnetic characteristics of a magnetoresistive device are improved by rendering magnetic debris non-magnetic during processing operations. Further improvement is realized by annealing the partially- or fully-formed device in the presence of a magnetic field in order to eliminate or stabilize magnetic micro-pinning sites or other magnetic abnormalities within the magnetoresistive stack for the device. Such improvement in magnetic characteristics decreases deviation in switching characteristics in arrays of such magnetoresistive devices such as those present in MRAMs.

21 Claims, 10 Drawing Sheets

(56) References Cited

U.S. PATENT DOCUMENTS

| | | | | |
|---|---|---|---|---|
| 6,262,869 B1 * | 7/2001 | Lin | B82Y 10/00 | 360/324.11 |
| 6,531,723 B1 * | 3/2003 | Engel | B82Y 25/00 | 257/200 |
| 6,818,961 B1 * | 11/2004 | Rizzo | B82Y 25/00 | 257/421 |
| 7,224,556 B2 * | 5/2007 | Pinarbasi | B82Y 10/00 | 360/324.11 |
| 7,465,589 B2 * | 12/2008 | Slaughter | G11C 11/5607 | 257/E21.665 |
| 7,635,974 B2 * | 12/2009 | Guo | B82Y 25/00 | 324/207.21 |
| 7,781,231 B2 * | 8/2010 | Li | B82Y 25/00 | 257/295 |
| 8,154,285 B1 * | 4/2012 | Hyde | G01R 33/445 | 324/309 |
| 8,431,418 B2 * | 4/2013 | Choi | B82Y 10/00 | 257/E21.665 |
| 8,802,451 B2 * | 8/2014 | Malmhall | B82Y 10/00 | 257/295 |
| 9,082,695 B2 * | 7/2015 | Satoh | H01L 27/222 | |
| 2005/0264958 A1 * | 12/2005 | Shvets | B82Y 25/00 | 360/327.32 |
| 2005/0277207 A1 * | 12/2005 | Costrini | B82Y 10/00 | 438/3 |
| 2006/0202244 A1 * | 9/2006 | Ju | H01L 27/226 | 257/295 |
| 2007/0256292 A1 * | 11/2007 | Tzeng | G11B 5/102 | 29/603.01 |
| 2009/0087589 A1 * | 4/2009 | Guo | B82Y 25/00 | 427/599 |
| 2010/0193888 A1 * | 8/2010 | Gu | H01L 43/12 | 257/421 |
| 2011/0076784 A1 * | 3/2011 | Druist | H01L 43/12 | 438/3 |
| 2013/0064971 A1 * | 3/2013 | Carey | G11B 5/3906 | 427/123 |
| 2013/0244344 A1 * | 9/2013 | Malmhall | B82Y 10/00 | 438/3 |

* cited by examiner

REDUCING SWITCHING VARIATION IN MAGNETORESISTIVE DEVICES

TECHNICAL FIELD

The disclosure herein relates generally to magnetoresistive devices and more particularly to the manufacture of such devices in a manner that reduces switching variation in such devices.

BACKGROUND

Magnetoresistive memory devices store information by varying the resistance across the memory device such that a read current through a memory cell in the memory device will result in a voltage drop having a magnitude that is based on the information stored in the memory cell. For example, in certain magnetic memory devices, the voltage drop across a magnetic tunnel junction (MTJ) can be varied based on the relative magnetic states of the magnetic layers within the memory cell. In such memory devices, there is typically a portion of the memory cell that has a fixed magnetic state and another portion that has a free magnetic state that is controlled to be either parallel or antiparallel to the fixed magnetic state. Because the resistance through the memory cell changes based on whether the free portion is parallel or antiparallel to the fixed portion, information can be stored by setting the orientation of the free portion. The information is later retrieved by sensing the orientation of the free portion. Such magnetic memory devices are well known in the art.

Writing magnetic memory cells can be accomplished by sending a spin-polarized write current through the memory device where the angular momentum carried by the spin-polarized current can change the magnetic state of the free portion. One of ordinary skill in the art understands that such a current can either be directly driven through the memory cell or can be the result of applying one or more voltages where the applied voltages result in the desired current. Depending on the direction of the current through the memory cell, the resulting magnetization of the free portion will either be parallel or antiparallel to the fixed portion. If the parallel orientation represents a logic "0", the antiparallel orientation may represent a logic "1", or vice versa. Thus, the direction of write current flow through the memory cell determines whether the memory cell is written to a first state or a second state. Such memory devices are often referred to as spin torque transfer memory devices. In such memories, the magnitude of the write current is typically greater than the magnitude of a read current used to sense the information stored in the memory cells.

Manufacturing magnetoresistive devices, including MTJ devices, includes a sequence of processing steps during which many layers of materials are deposited and then patterned to form a magnetoresistive stack and the electrodes used to provide electrical connections to the magnetoresistive stack. The magnetoresistive stack includes the various layers that make up the free and fixed portions of the device as well as one or more dielectric layers that provide at least one the tunnel junction for the MTJ device. In many instances, the layers of material are very thin, on the order of a few or tens of angstroms. Similarly, the dimensions of such layers after patterning and etching are extremely small, and small deviations or imperfections during processing can have a significant impact on device performance.

Because an MRAM device may include thousands or millions of MTJ elements, precise processing steps used in manufacturing the devices can contribute to increased densities by allowing devices to be placed in close proximity without unwanted interaction. Moreover, such accurate processing helps to minimize deviations in device characteristics, such as switching voltages, across devices included in the MRAM. Therefore, it is desirable to provide techniques for manufacturing such devices that support increased densities and promote minimizing the variance of certain characteristics amongst devices.

DETAILED DESCRIPTION

Figure 1:
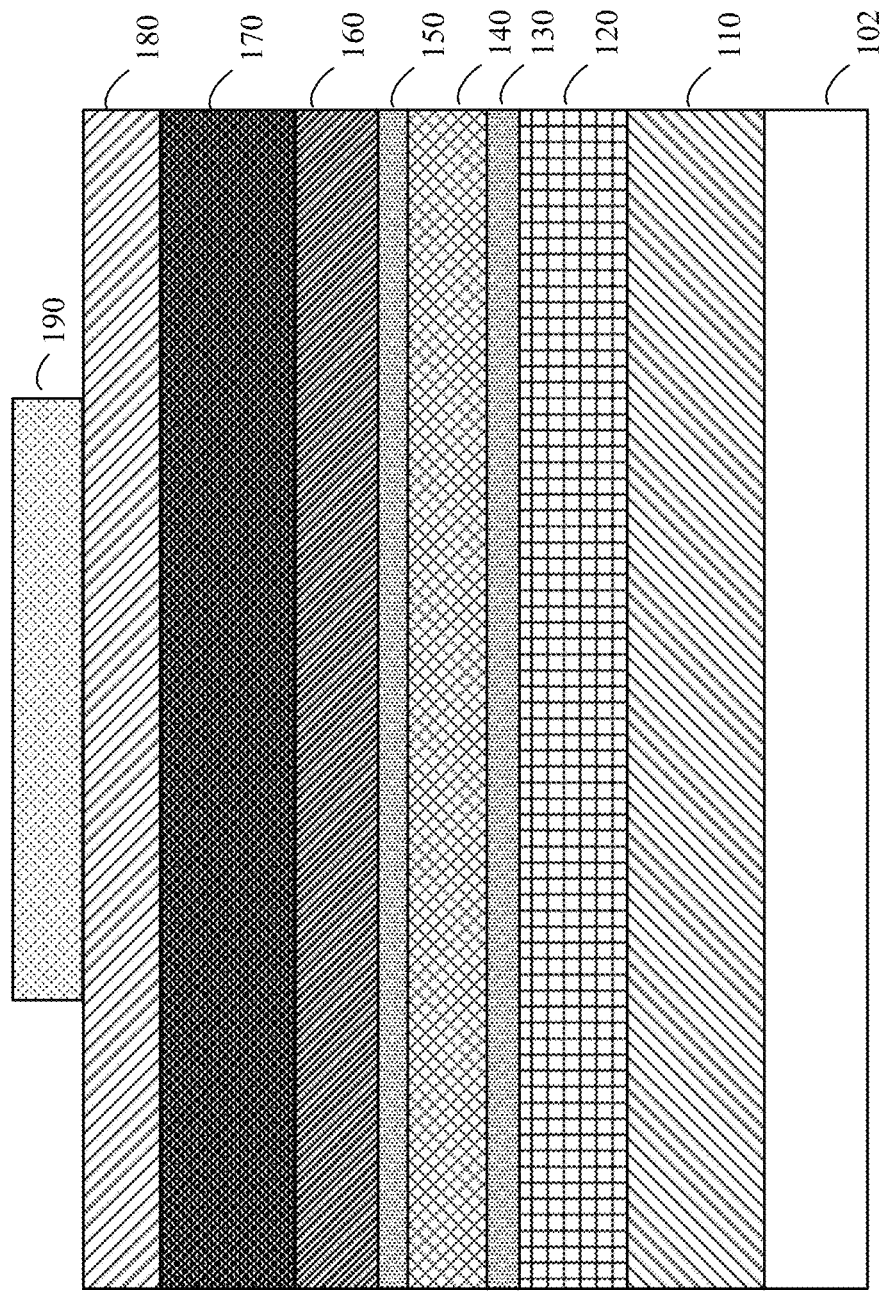
FIGS. 1-7 illustrate cross-sectional views of layers included in a magnetoresistive device during different stages of the manufacturing of the magnetoresistive device in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to improve understanding of the example embodiments. For example, one of ordinary skill in the art appreciates that the cross-sectional views are not drawn to scale and should not be viewed as representing proportional relationships between different layers. The cross-sectional views are provided to help illustrate the processing steps performed by simplifying the various layers to show their relative positioning. Moreover, while certain layers and features are illustrated with straight 90-degree edges, in actuality or practice such layers may be more "rounded" and gradually sloping.

The terms "comprise," "include," "have" and any variations thereof are used synonymously to denote non-exclusive inclusion. The term "exemplary" is used in the sense of "example," rather than "ideal."

During the course of this description, like numbers may be used to identify like elements according to the different figures that illustrate the various exemplary embodiments.

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or that not exposed to the radiation, is removed by the application of a developer. The underlying layer, not protected by the remaining resist, can then be etched such that the layer overlying the substrate is patterned. Alternatively, an additive process can be used in which a structure is built up using the photoresist as a template.

There are many inventions described and illustrated herein, as well as many aspects and embodiments of those inventions. In one aspect, the described embodiments relate to, among other things, methods of manufacturing a magnetoresistive-based device having one or more electrically conductive electrodes or conductors on either side of a magnetic material stack. As described in further detail below, the magnetic material stack may include many different layers of material, where some of the layers include magnetic materials, whereas others do not. In some embodiments, the methods of manufacturing include forming the layers for the magnetoresistive device and then masking and etching those layers to produce a magnetic tunnel junction (MTJ) device. Examples of MTJ devices include transducers such as electromagnetic sensors as well as memory cells.

Magnetoresistive devices are typically formed to include a top electrode and a bottom electrode that permit access to the device by allowing for connectivity to other circuit elements. Between the electrodes is a set of layers, including a fixed layer and a free layer on either side of a dielectric layer that forms a tunnel barrier. In some embodiments, the fixed layer achieves its fixed magnetization based on interaction with an antiferromagnetic material. In other embodiments, the fixed magnetization may be achieved through other means, including the manner in which the fixed layer was formed, shape anisotropy, etc. In manufacturing such magnetoresistive devices, a set of layers is first deposited on the wafer and then patterned and etched in multiple steps to define the electrodes and the various layers in between. Some of the materials included in the layers within the magnetoresistive device are susceptible to degradation during reactive etching or other manufacturing. Such degradation can be detrimental as it may interfere with subsequent processing steps or the magnetic behavior of the device once completed. In particular, magnetic debris resulting from etching or surface treatment operations can result in micro-pinning sites in the magnetoresistive device structure, where such micro-pinning sites can affect the magnetic characteristics of certain layers, and thereby affect the switching behavior of the magnetoresistive device. Similarly, abnormalities or imperfections within magnetic layers of the magnetoresistive stack can also negatively impact the switching characteristics of the device. The impact of such micro-pinning sites or other imperfections can cause deviations in the switching characteristics amongst a large number of devices included together in an array, such as in an MRAM. In other words, for a large group of memory cells in an array, the amount of voltage or current required to cause each of the cells to switch can vary significantly. Such a wide distribution of switching characteristics amongst the devices is undesirable as it makes accurate storage and retrieval of information more difficult. Furthermore, these micro-pinning sites or other imperfections can also cause increased variability among the cells in their susceptibility to unintended switching by random thermal disturbances of the free layer magnetic moment, thereby compromising the non-volatility of the MRAM over time.

In order to avoid undesirable impacts on magnetic layers included in the magnetoresistive device stack structure, one technique described herein provides for rendering magnetic debris, which results from device processing, nonmagnetic. Rendering the magnetic debris non-magnetic lessens its potential impact on the magnetic layers and magnetic characteristics of the device. Another technique described herein utilizes post-processing annealing in the presence of a magnetic field to help clean up the magnetic layers and magnetic characteristics of the device. As described in more detail below, such post-processing annealing can take place at various points in time with in the device manufacturing process. For example, the post-processing annealing may occur after a portion of the magnetoresistive stack has been etched (e.g. just before or after the tunnel barrier is defined), after the entire device is fully-formed and encapsulated, or at multiple points during the process based on the composition and relative positioning of the layers within the device.

FIG. 1 illustrates a cross-sectional view of a partially formed magnetoresistive device disposed on a substrate 102. The cross-sectional view shows a plurality of layers, where each of the layers is formed, deposited, grown, sputtered, or otherwise provided. The layers may be deposited using any technique now known or later developed. The simplified cross-sectional view presented in FIG. 1 includes electrically conductive layer 110, lower magnetic material layer 120, dielectric layer 130, upper magnetic material layer 140, dielectric layer 150, spacer layer 160, electrically conductive layer 170, hard mask layer 180, and patterned photoresist layer 190. The patterned photoresist layer 190 may be deposited and patterned using any technique now known or later developed, for example, well known conventional deposition and lithographic techniques.

The electrically conductive layers 110 and 170 provide the material used to define the top and bottom electrodes for the magnetoresistive device. While illustrated to include example layers 120-160, the remaining layers within the magnetoresistive stack may include a number of different layers of both magnetic and nonmagnetic material. For example, the layers may include multiple layers of magnetic material, dielectric layers that provide one or more tunnel barriers or diffusion barriers, coupling layers between layers of magnetic material that provide for ferromagnetic or antiferromagnetic coupling, one or more layers of anti-ferromagnetic material, as well as other layers utilized in magnetoresistive stacks as currently known or later developed. For example, the lower layer of magnetic material may include a set of layers forming a synthetic antiferromagnetic structure (SAF), the dielectric layer 130 may correspond to a tunnel barrier, and the upper magnetic material layer 140 may include a set of layers corresponding to a synthetic ferromagnetic structure (SYF). In another embodiment, the lower layer of magnetic material 120 may include a SAF structure as well as a layer of antiferromagnetic material that provides a reference magnetic field for the SAF structure. Notably, each of the layers shown to be included in the magnetoresistive device may be a composite layer that includes multiple sub-layers. Other embodiments may include multiple SAFs, SYFs, and tunnel barriers in addition to the other layers, where the materials and structures are arranged in various combinations and permutations now known or later developed. Furthermore, once etched into patterned bits, the magnetic layers 120 and 140 may have their easy axis of magnetization oriented either in the plane of the thin films or perpendicular to the plane of the thin films.

Figure 2:
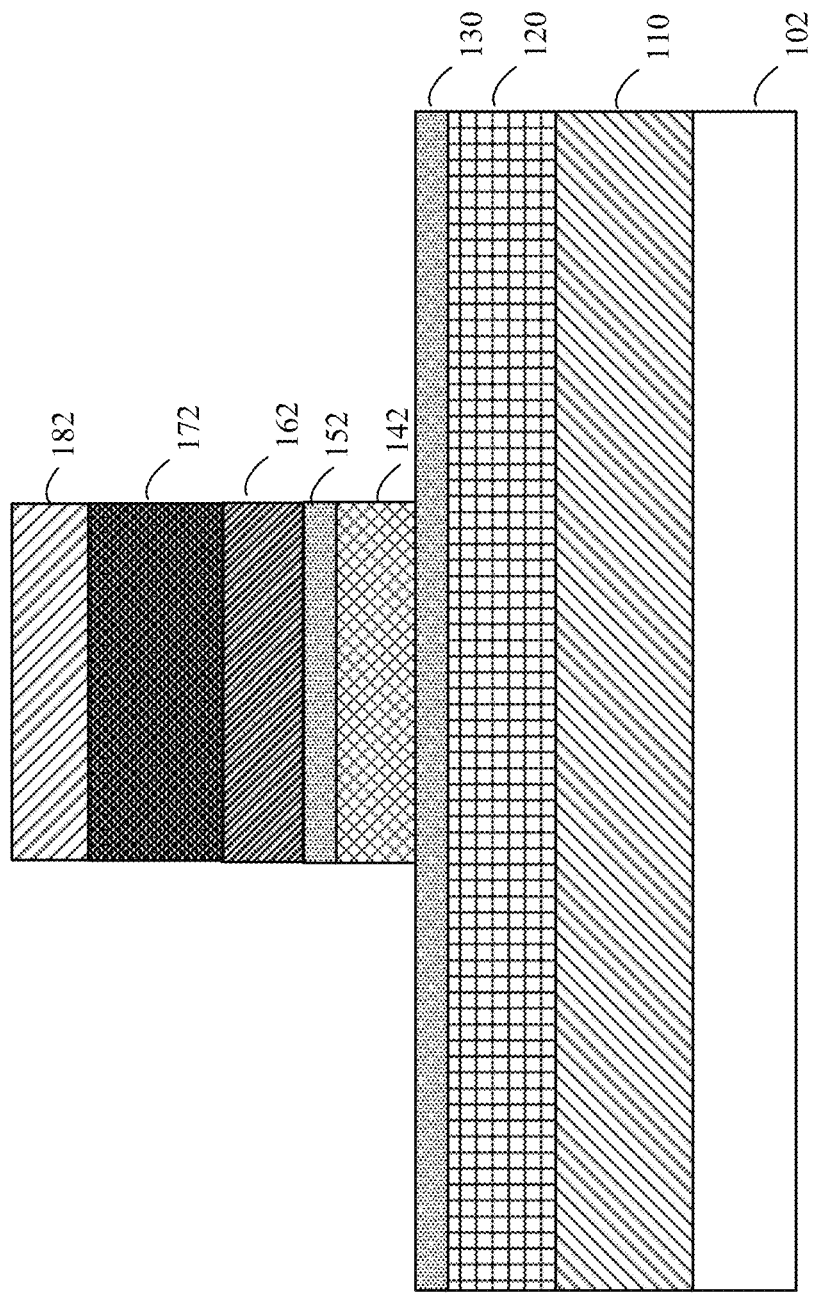

In FIG. 2, the cross-sectional view of FIG. 1 is updated to reflect the formation of the top electrode 172 from the electrically conductive layer 170 as well as the further definition of the spacer layer 160 to form the etched spacer layer portion 162 of the stack, the further definition of the dielectric layer 150 to form a diffusion barrier 152 of the stack, and the further definition of the upper magnetic material layer 140 to form the upper magnetic portion 142 of the stack. Each of these formation steps may be accomplished using known or later developed techniques, including various etching techniques that rely on appropriate etching materials to define the various layers. For example, the top electrode 172 may be formed using a two-step etch process such as that described in co-pending U.S. patent application Ser. No. 14/296,181 entitled "Method for Top Electrode Etch in a Magnetoresistive Device and Devices Manufactured Using Same,", which is incorporated by reference herein. In other embodiments, the top electrode 172 is formed using other techniques, both known and later developed.

In one embodiment the upper magnetic portion 142 of the stack structure corresponds to the free layer, or free portion, of the stack structure. In such an embodiment, the upper magnetic portion 142 may be a SYF structure that includes multiple magnetic layers and one or more associated coupling layers. Such SYF structures are well known in the art. In other embodiments, the upper magnetic portion 142 may correspond to the fixed layer, or fixed portion, of the stack structure. In such embodiments, the fixed layer may include a SAF structure, or some other layer of magnetic material that has a fixed magnetic orientation. Like SYF structures, SAF structures are also well known in the art.

Figure 3:
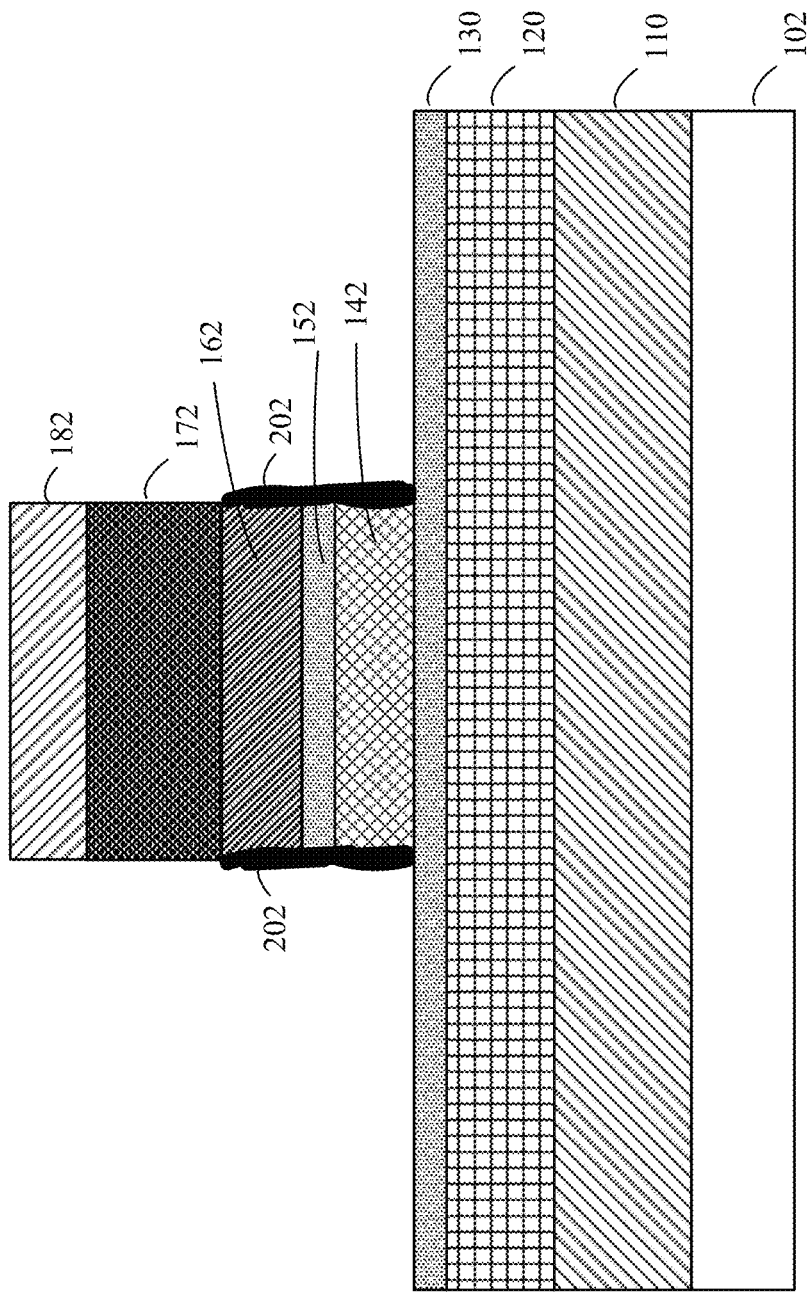

In FIG. 3, the cross-sectional view illustrated reflects sidewall roughness 202 that may result from the etching processes used to form the etched layers shown in FIG. 2. The sidewall roughness 202 may include magnetic debris that can negatively impact the switching characteristics of the device. Moreover, the sidewall roughness 202 can include degradation of the layers etched, including upper magnetic layer portion 142, diffusion barrier 152, and possibly spacer layer 162. In other words, the sidewall roughness 202 can represent both debris remaining after etching that adheres to the sidewalls as well as imperfections or degradation within the etched layers themselves that may be the result of the processing performed.

Figure 4:
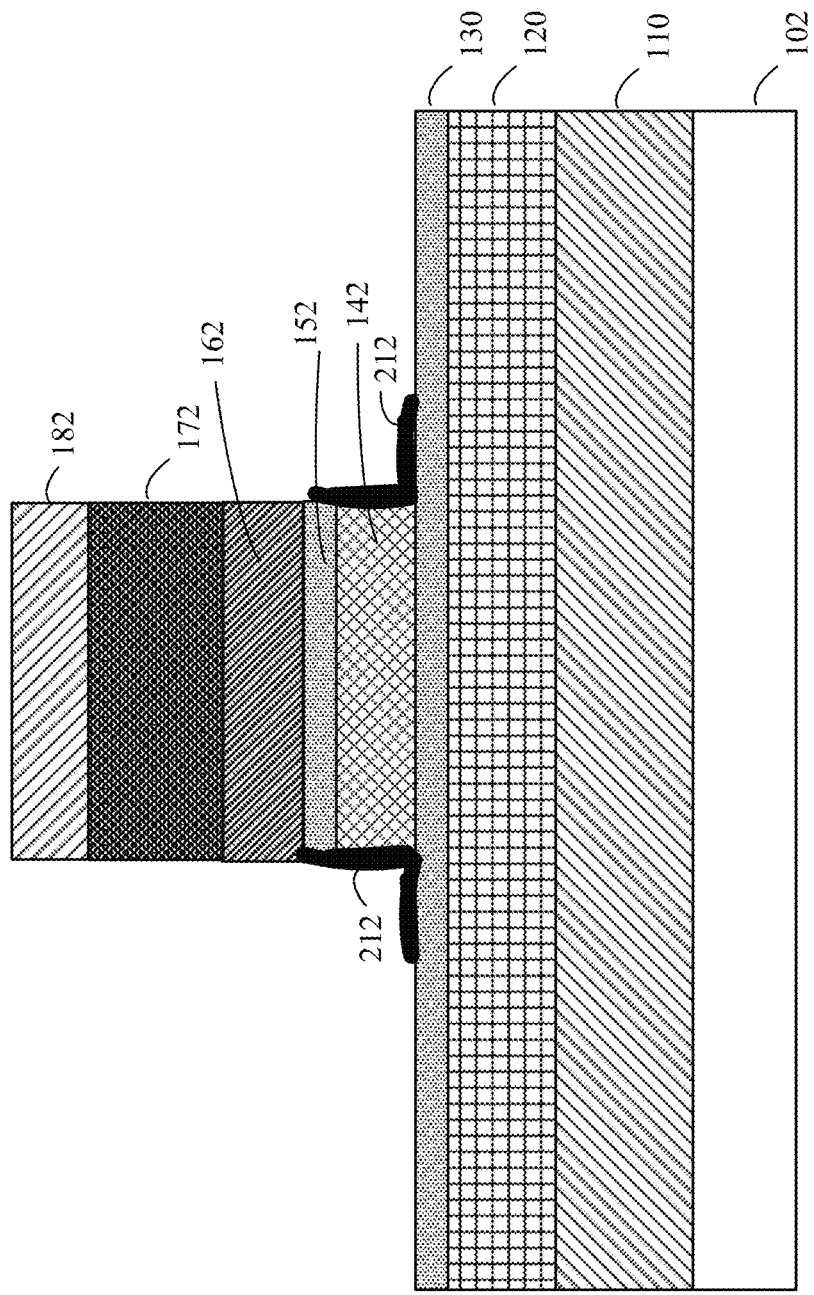

In some embodiments, after etching the layers as shown in FIG. 2, surface treatment, such as a physical etch, may be used to clear at least some of the residual material and lessen the impact of the sidewall roughness 202. The results of such surface treatment are shown in FIG. 4, where the sidewall roughness 202 has been reduced, but where residual material 212 is still present. The surface treatment, which may be referred to as "backsputtering," can itself negatively impact the layers that the surface treatment is intended to clean up. Residual material 212 represents any remaining residual debris that was not fully cleared as well as any new debris resulting from the surface treatment itself. For example, the surface treatment may degrade or otherwise negatively impact the dielectric layer 130, which serves as the tunnel barrier for the magnetoresistive device. The surface treatment may also negatively impact the upper magnetic layer portion 142. The surface treatment may also pierce through the dielectric layer 130 and damage or expose the underlying magnetic layer 120. Because these layers are eventually rendered inaccessible to further etching or other chemical treatment, it is desirable to repair any such damage to the various layers while they are still accessible (e.g. prior to encapsulation).

Figure 5:
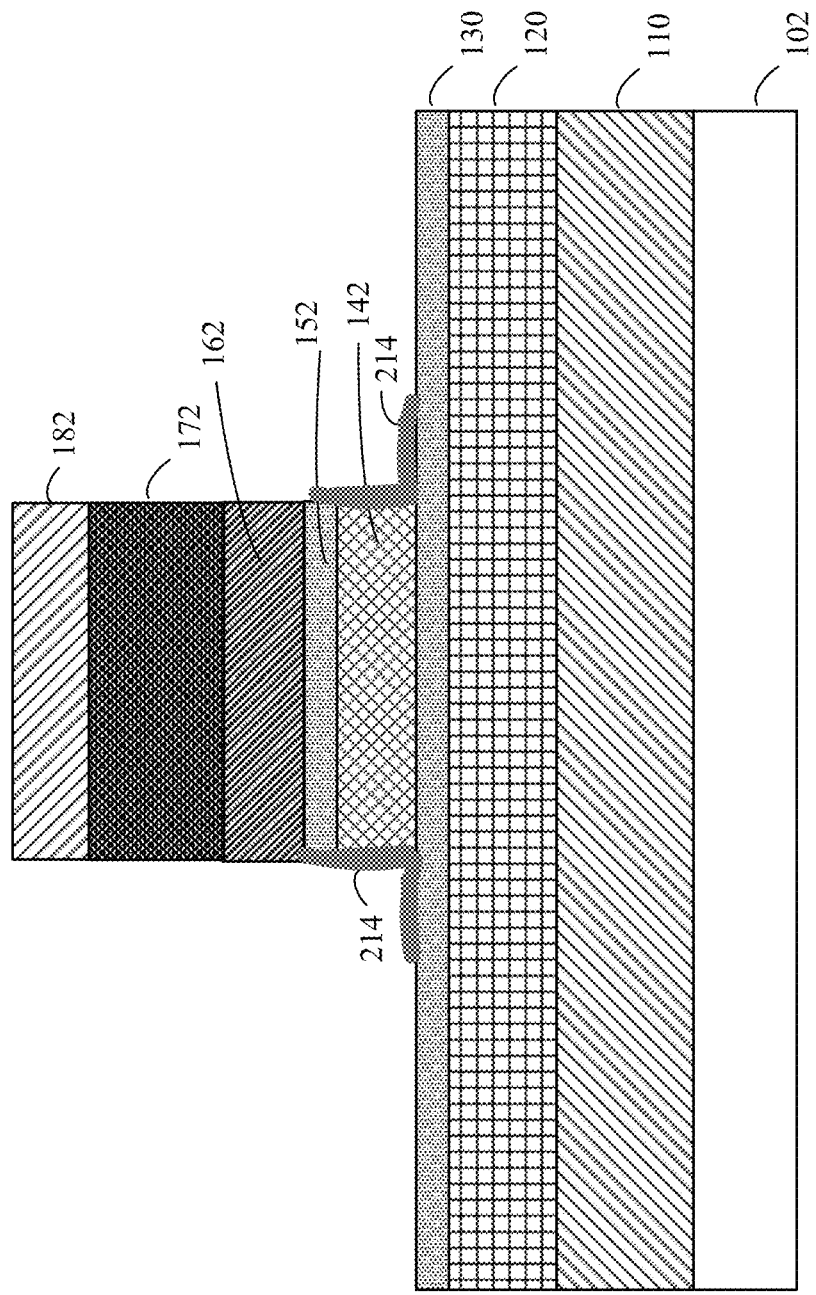

One technique that helps to alleviate the effects of magnetic debris is to render that debris non-magnetic. FIG. 5 shows the cross-sectional view from FIG. 4 following exposure of the partially-etched and surface-treated structure to reactive gas or plasma. Such reactive gas or plasma may include non-magnetizing gas or non-magnetizing plasma that reacts with the residual magnetic debris, thereby rendering the magnetic debris nonmagnetic. Thus, as shown in FIG. 5, the residual material 212 has been transformed into nonmagnetic residual material 214. Examples of non-magnetizing gas or non-magnetizing plasma used to demagnetize any magnetic debris include $O_2$, $N_2$, and $Cl_2$. By rendering the debris non-magnetic, its potential influence on the magnetic layers and switching characteristics of the device is reduced, thereby helping to maintain uniform switching characteristics across an array of such devices as individual devices are less impacted by varying amounts of debris resulting from processing.

Figure 6:
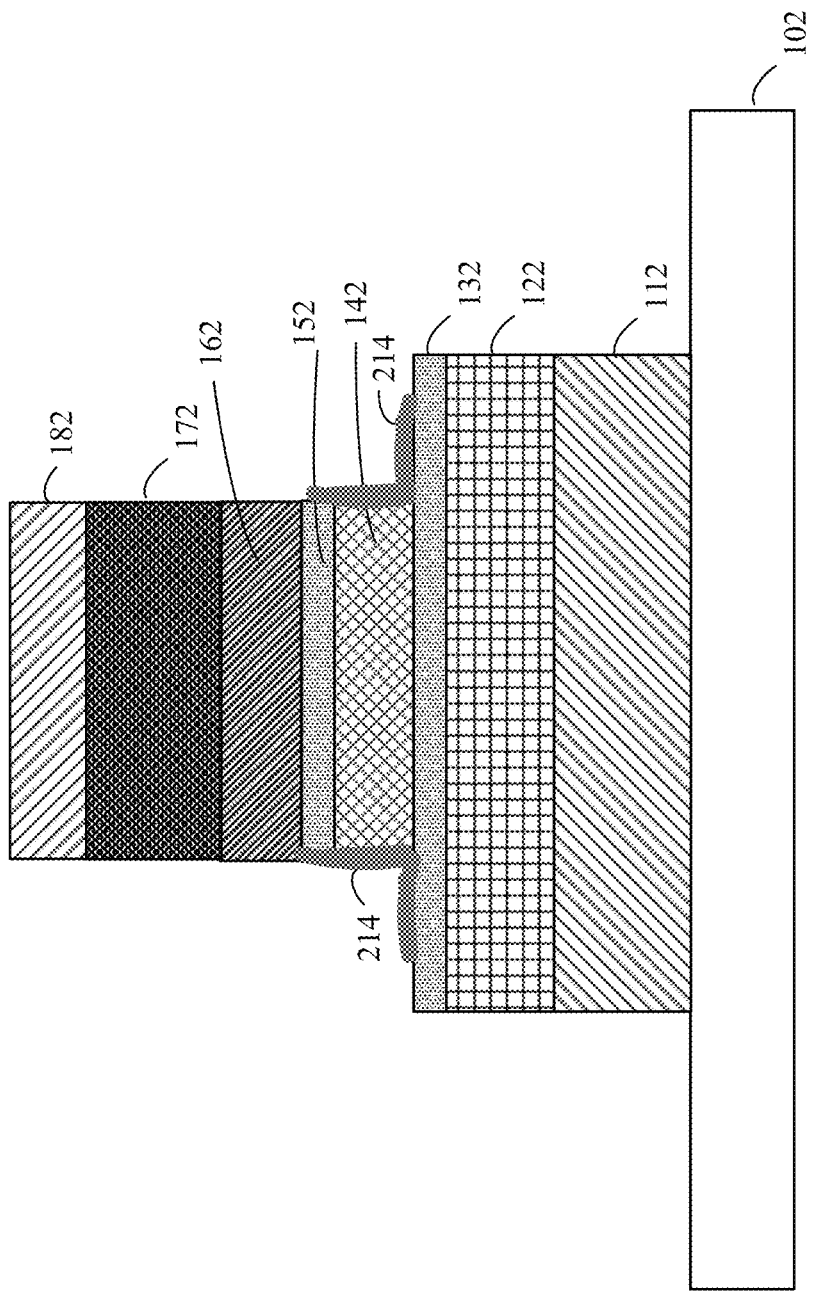

FIG. 6 illustrates a cross-sectional view corresponding to FIG. 5 following subsequent etching steps used to form the tunnel barrier 132, the lower magnetic portion 122 of the stack, and the bottom electrode 112. Formation of these magnetoresistive device portions may be accomplished using techniques known or later developed. In other embodiments, the techniques described in U.S. patent application Ser. No. 14/296,153 entitled "Isolation of Magnetic Layers During Etch in a Magnetoresistive Device". As discussed in application Ser. No. 14/296,153, which is incorporated by reference herein, the formation of these portions of the device can include encapsulating the sidewalls of one or more of the etched layers included in the magnetoresistive device stack prior to subsequent etching operations. For example, the tunnel barrier 132 and a portion of the lower layer of magnetic material 122 may be encapsulated prior to etching of the bottom electrode 112. In embodiments in which the lower layer of magnetic material includes anti-ferromagnetic material, encapsulation of the tunnel barrier 132 and other layers susceptible to degradation may occur prior to a corrosive etch used to define the layer of anti-ferromagnetic material. Such encapsulation may also protect the sidewalls of the encapsulated layers from residual material resulting from etching the layers underlying the encapsulated layers.

Figure 7:
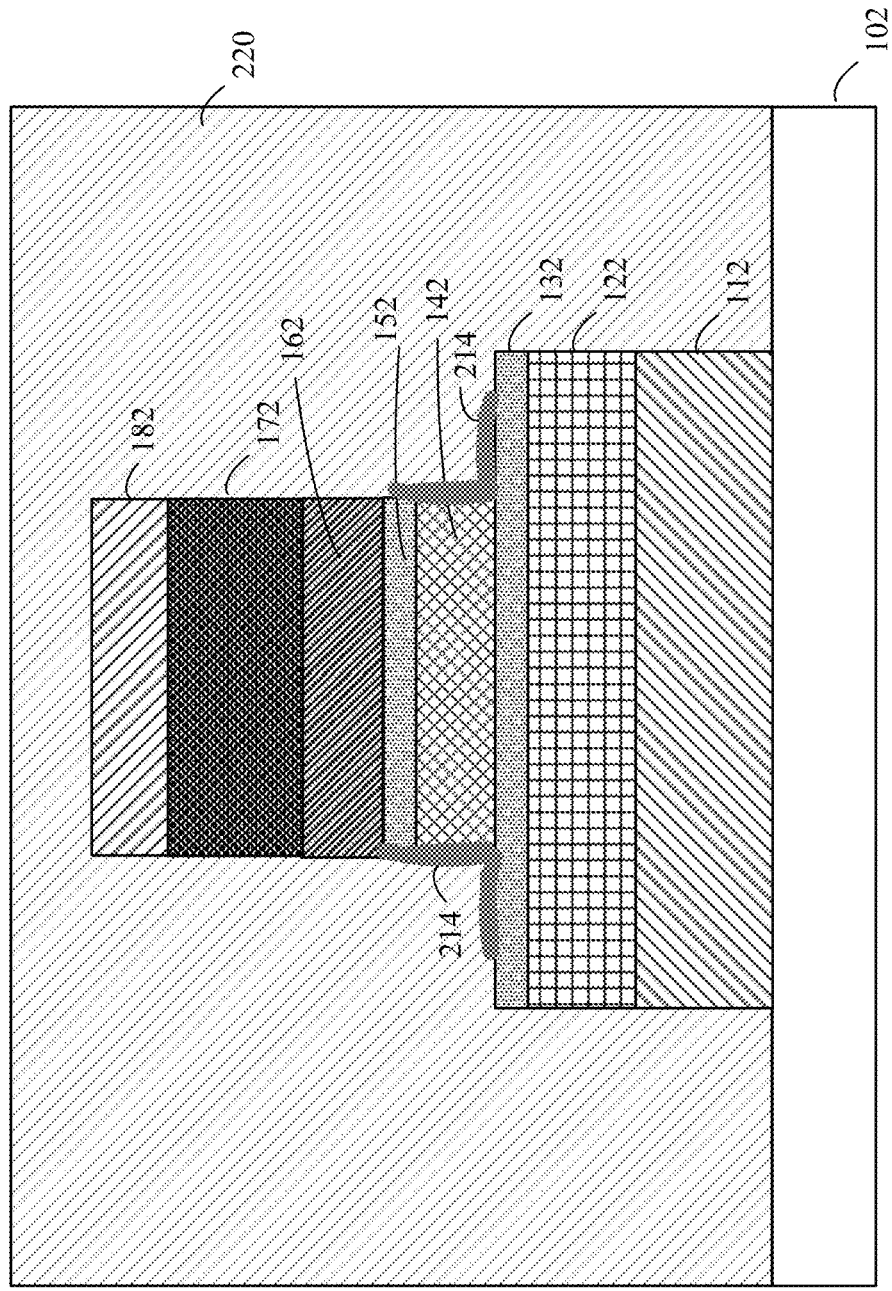

FIG. 7 illustrates a cross-sectional view corresponding to FIG. 6 following encapsulation of the magnetoresistive device with material 220. Material 220 may include hard mask material or other forms of inert material that protect the layers within the device and ensure they are not impacted by any subsequent processing. In order to help repair any magnetic abnormalities within the various magnetic layers of the magnetoresistive device, the structure shown in FIG. 7 may be subjected to an annealing step in the presence of a magnetic field. Annealing operations expose the partially- or fully-formed device to higher temperatures, and by heating the device structure in the presence of such a magnetic field, some or all of the magnetic disturbances that may have been created within the magnetic layers during processing can be corrected or neutralized. Such annealing improves the quality of the layers in terms of their magnetic characteristics, thereby improving the switching characteristics of the device and reducing any variance in those switching characteristics amongst multiple devices included in an array (e.g. in an MRAM device).

In one embodiment, multiple annealing steps may be used to remove discontinuities and pinning sites as well as establish magnetic orientations used as a reference for one or more fixed layers. For example, following deposition of the layers shown in FIG. 1, an initial annealing step may be used in order to orient the magnetic pinning direction within one or more anti-ferromagnetic layers included in the plurality of layers. For example, if the lower layer of magnetic material 120 includes an antiferromagnetic layer used as a reference for a fixed layer, an initial annealing step, which takes place prior to the etching and processing steps illustrated in FIGS. 2-7, may be used to orient the pinning direction for the antiferromagnetic layer. In view of the presence of the antiferromagnetic material, the magnetic field applied during this initial annealing step may correspond to the desired magnetic orientation for the antiferromagnetic layer. In such an embodiment, any subsequent annealing, such as that performed after some or all of the processing that defines the magnetoresistive device structure, may utilize a different temperature, different magnetic field, or different magnetic field direction in order to best accomplish the desired result. For example, an annealing step performed after the encapsulation illustrated in FIG. 7 may use a lower temperature than that used for the initial annealing step. Similarly, the magnetic field used during the later annealing may be oriented along the easy axis of the free layer in the magnetoresistive device stack in order to better address any abnormalities included therein.

Notably, in other embodiments, multiple annealing steps may be used where such annealing steps occur at various stages in development of the magnetoresistive device stack. For example, following encapsulation of a portion of the magnetoresistive device structure, an annealing operation may be used to help remove any discontinuities or pinning sites developed through the etching operations and any related surface treatment performed up to that point in the device processing. Thus, while certain embodiments that include annealing at particular times in the device formation process are described in detail herein, it is contemplated that annealing steps can be performed following some or all of the device formation. Such annealing operations typically would be performed with a magnetic field oriented along the easy axis of the patterned free layer and can help improve the magnetic characteristics of the various layers within the magnetoresistive device, including any free layers and fixed layers, thereby improving device performance. The direction of the magnetic field applied during any of the annealing steps described can either be oriented in the plane of the thin films or perpendicular to the plane of the thin films as desired.

Figure 8:
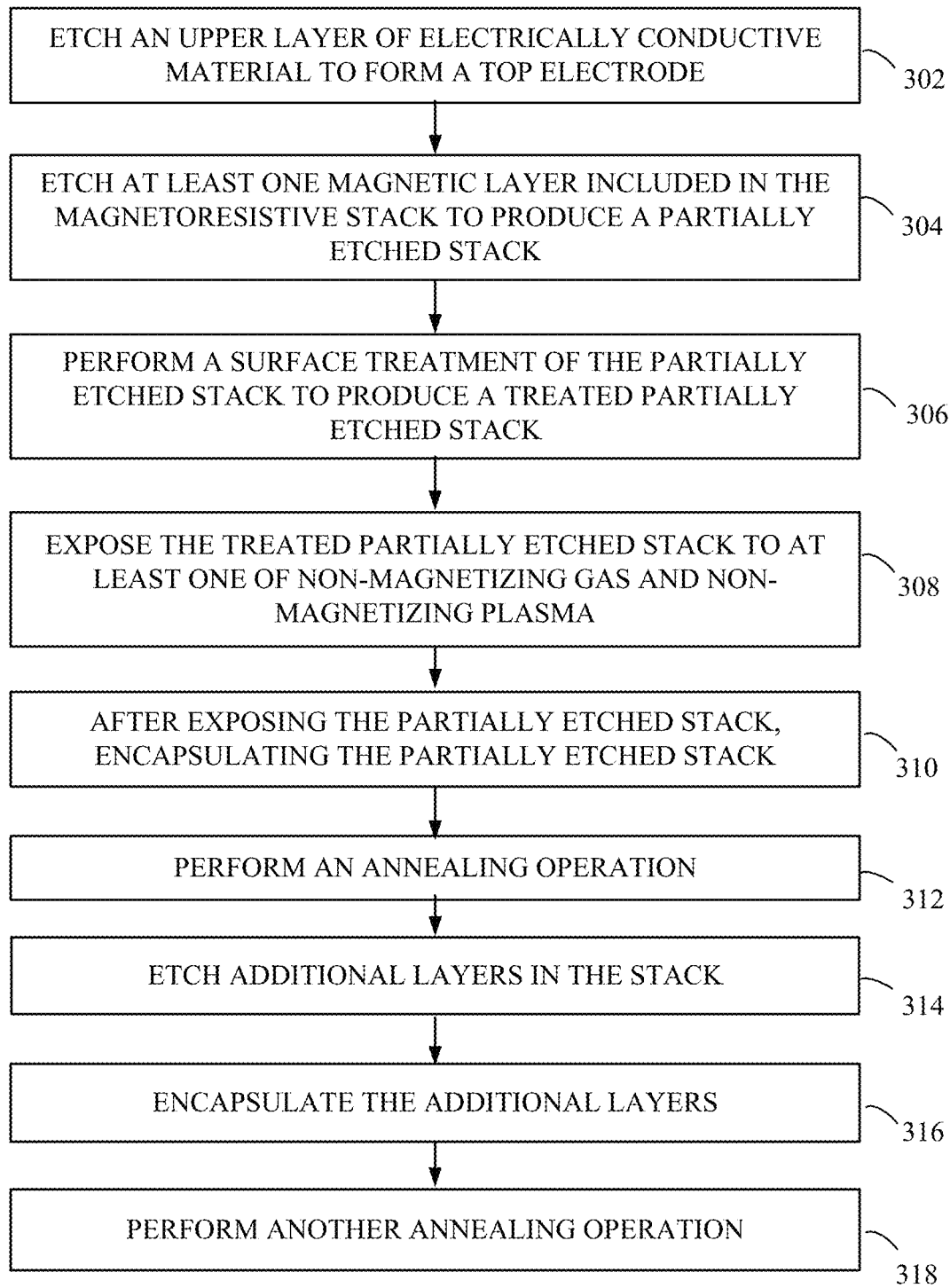
FIGS. 8-10 are flow charts of methods of manufacturing a magnetoresistive device in accordance with exemplary embodiments.
Figure 9:
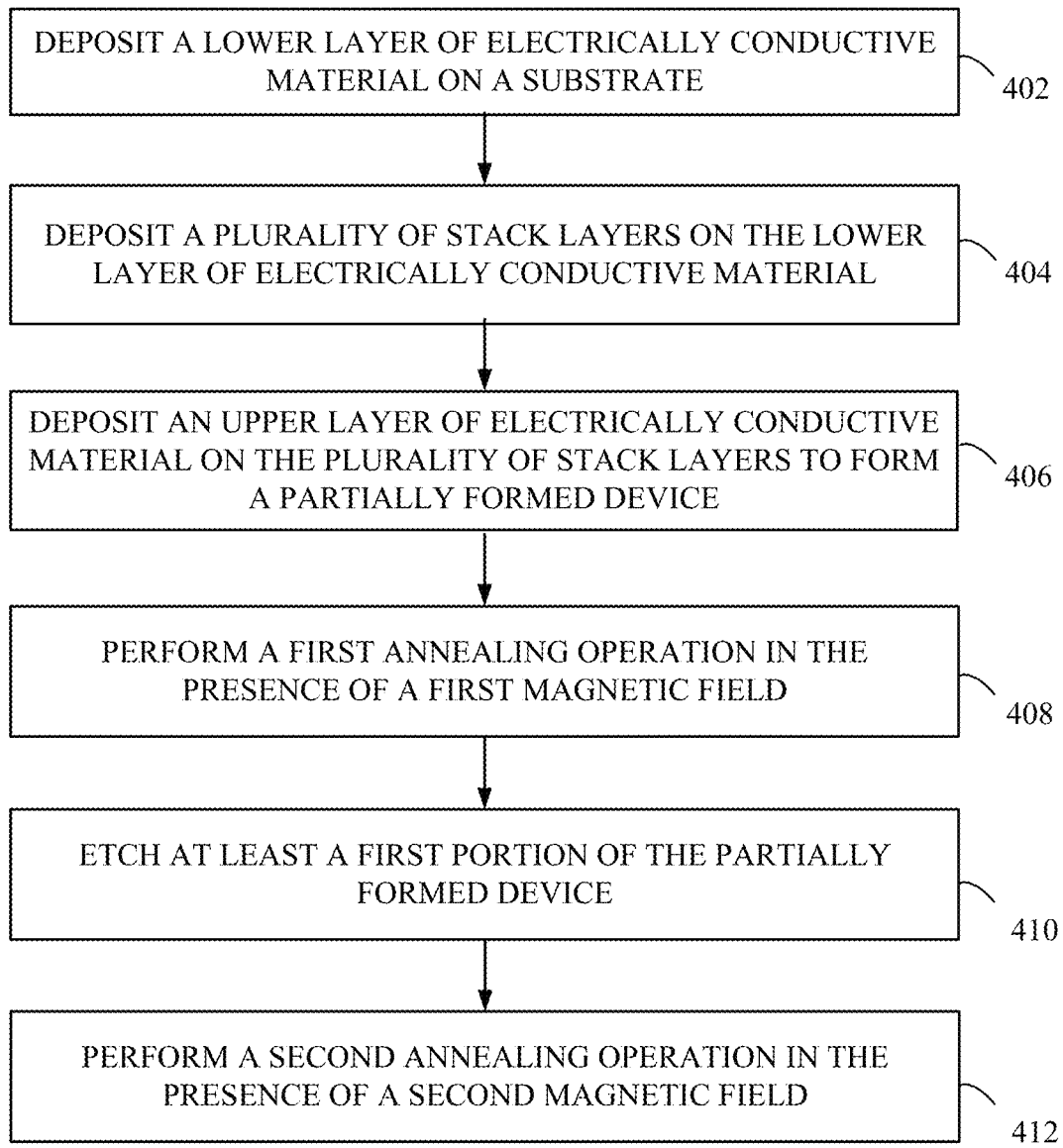
Figure 10:
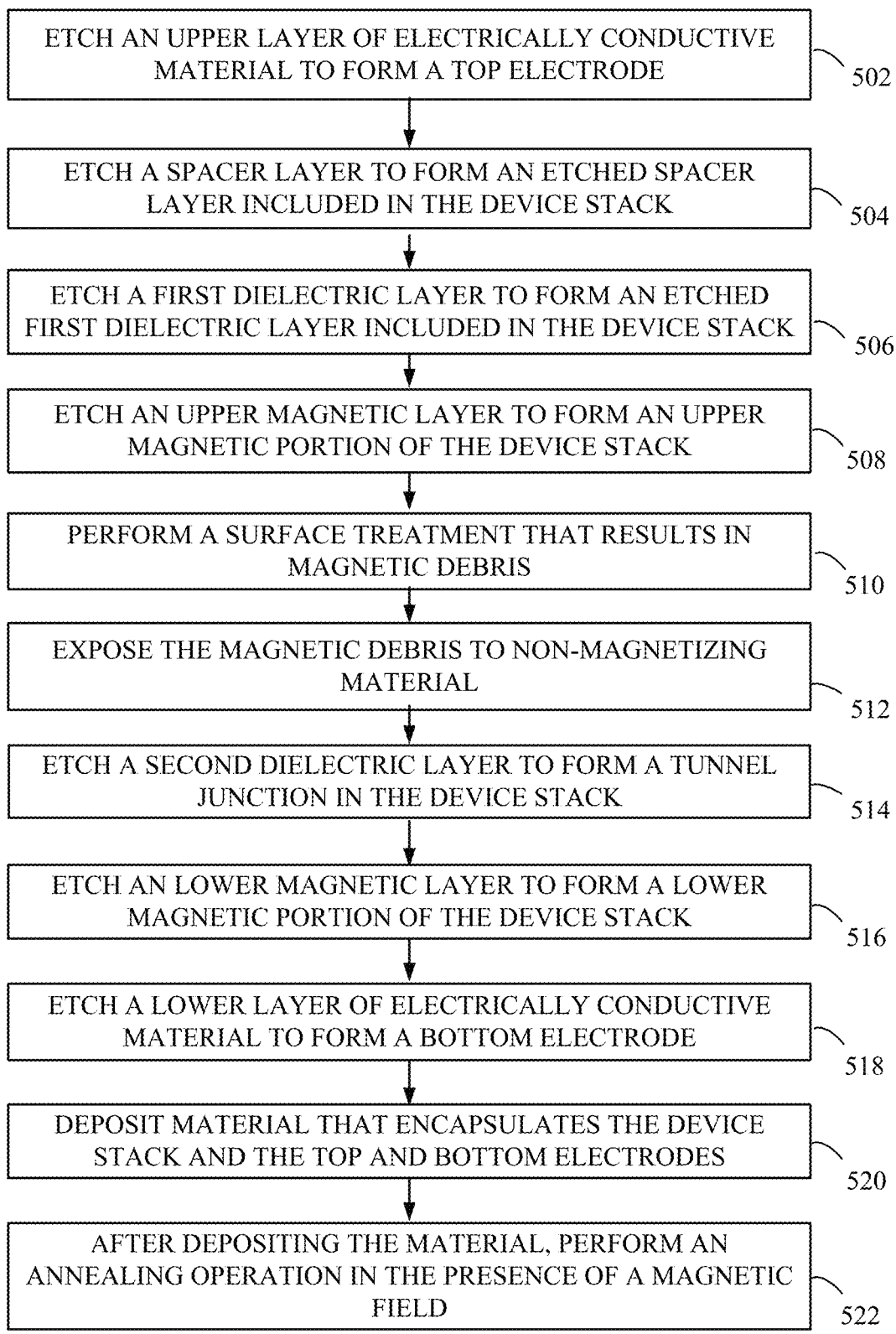

FIGS. 8-10 are flow charts that illustrate exemplary embodiments of a method of manufacturing a magnetoresistive device, where, in one example, the magnetoresistive device is a spin-torque MTJ device included in an MRAM. The operations included in the flow charts may represent only a portion of the overall process used to manufacture the device. The various tasks performed in connection with the methods of FIGS. 8-10 may be performed by software, hardware, firmware, or any combination thereof. For illustrative purposes, the following description of the methods in FIGS. 8-10 may refer to elements mentioned above in connection with FIGS. 1-7. In practice, portions of methods may be performed by different elements of the described system, e.g., a processor, a display element, or a data communication component. It should be appreciated that methods may include any number of additional or alternative tasks, the tasks shown in FIGS. 8-10 need not be performed in the illustrated order, and the methods may be incorporated into a more comprehensive procedure or process having additional functionality not described in detail herein. Moreover, one or more of the tasks shown in FIGS. 8-10 could be omitted from an embodiment as long as the intended overall functionality remains intact.

FIG. 8 illustrates a flow chart of a portion of the magnetoresistive device manufacturing process. Not shown in FIG. 8 is the deposition of the various layers making up the device, or any pre-etching annealing steps that may occur to orient the magnetization of any antiferromagnetic layers included in the device stack. At 302 an upper layer of electrically conductive material is etched to form a top electrode. At 304 at least one magnetic layer included in the magnetoresistive stack is etched to produce a partially etched stack. As noted above, the device stack for the magnetoresistive device includes many different layers, some of which are magnetic and others of which are not. Moreover, before reaching the magnetic layer etched at 304, a spacer layer under the upper layer of electrically conductive material may be etched to form an etched spacer layer and a second dielectric layer under the spacer layer may be etched to form an etched site second dielectric layer that serves as a diffusion barrier. Such layers, while not necessarily present, are illustrated in the cross-sectional views presented in FIGS. 1-7. The etching performed at 304 may include etching one or more magnetic layers included in a SYF or SAF structure that is part of the free or fixed portion of the device stack.

As also discussed above in the context of FIGS. 1-7, following the etching of the upper magnetic layer, a surface treatment may be performed at 306 (e.g. "backsputtering") in order to clear away undesirable material and produce a treated partially etched stack. However, as also noted above, such surface treatment may result in magnetic debris remaining behind as well as new magnetic debris being generated based on the surface treatment itself. Thus, at 308 the treated partially etched stack is exposed to non-magnetizing material, such as one or more of a non-magnetizing gas and a non-magnetizing plasma. Through such exposure, some or all of the magnetic debris is rendered nonmagnetic, thereby reducing its potential impact on device performance.

At 310, after exposure of the partially etched stack to the gas or plasma, some or all of the resulting partially etched stack is encapsulated. For example, the exposed sidewalls of the layers etched thus far may be encapsulated. Encapsulation may include exposing the sidewalls to a reactive gas (passivation) or depositing a layer of liner material on the sidewalls. In the case of exposing the sidewalls to a reactive gas, this may include oxidizing the sidewalls, nitridizing the sidewalls, or exposing the sidewalls to a corrosive gas to provide controlled corrosion of the sidewalls. In the case of depositing a layer of liner material on the sidewalls, the liner material is preferably a non-magnetic dielectric material that insulates the sidewalls from further etching steps. In another example, the majority or all of the device layers are etched prior to encapsulation such that the completed device is encapsulated in its entirety. In such an example, a hard mask material such as $SiO_2$ may be used to encapsulate the device.

At 312, an annealing operation is performed in the presence of a magnetic field. As discussed above, the annealing operation exposes the partially or fully formed device to high heat levels in the presence of a magnetic field that can help mitigate any magnetic defects present in the device after the processing operations that have been thus-far performed. As also noted above, it may be appropriate to limit the temperature of such annealing operations based on which layers have already been fully formed within the device structure. For example, layers within the magnetoresistive device stack are often very thin and susceptible to degradation in high heat environments. As such, it may be appropriate to limit the temperature of the anneal operation to be less than that used during any annealing that occurs before etching to define the device structure begins. For example, latter annealing operations preferably utilize a temperature less than 300° C. In other embodiments, based on, for example, the materials included in the layers and their dimensions, a temperature of less than 250° C. is more preferred. In yet other embodiments, the device materials and structure may result in an appropriate anneal temperature of less than 200° C. Using such lower temperatures for the annealing operations helps to minimize interaction between the different layers within the partially or fully formed magnetoresistive device structure.

As illustrated in 314, 316, and 318, additional etching, encapsulation, and annealing may occur during the device formation process. Thus, assuming that the encapsulation and annealing at 310 and 312 occurs prior to completion of the etching operations corresponding to the magnetoresistive device formation, additional etching, encapsulation, and annealing can occur during processing of the subsequent underlying layers within the magnetoresistive device structure. For example, annealing may occur immediately after the etching up to or including the tunnel junction, after hard mask deposition used to pattern the etching of the lower magnetic layer and bottom electrode, after portions of the etching process used to define the lower magnetic layer, after the definition of the bottom electrode, or after all processing aspects corresponding to the magnetoresistive device have been completed. Encapsulation of the various portions of the device may be performed prior to such annealing steps to help minimize any potential negative impact of the annealing steps on vulnerable layers. Thus, the annealing operation or operations targeted at improving the magnetic characteristics of the device can occur at various points in time within the processing of the magnetoresistive device. The timing of such annealing operations may be selected to coincide with a point in time at which susceptible layers have been protected through encapsulation or other means, while layers expected to be improved by the annealing are ripe for such improvement.

FIG. 9 illustrates a flow chart of a portion of the magnetoresistive device manufacturing process. At 402, a lower layer of electrically conductive material is deposited on a substrate. At 404, a plurality of stack layers are deposited on the lower layer of electrically conductive material. The plurality of stack layers include layers of magnetic material and at least one dielectric layer corresponding to a tunnel junction. As discussed above, additional spacer layers and antiferromagnetic layers may also be included within the stack layers, along with other layers of material known or later found to be useful in such stacks in magnetoresistive devices. In one example embodiment, the deposition performed at 404 includes depositing an antiferromagnetic layer, a set of layers corresponding to a SAF structure, a dielectric layer corresponding to a tunnel barrier, a set of layers corresponding to a SYF structure, a dielectric layer corresponding to a diffusion barrier, and a spacer layer.

At 406, an upper layer of electrically conductive material is deposited on the plurality of stack layers to form a partially formed device. As discussed above, the upper and lower layers of electrically conductive material provide the material used to form the top and bottom electrodes that allow access to the magnetoresistive device by other circuitry. Following deposition of the upper layer of electrically conductive material, a hard mask layer and a patterned layer of photoresist may be formed on top of the upper layer of electrically conductive material in order to allow the underlying layers to begin to be defined and etched.

At 408, a first annealing operation is performed in the presence of a first magnetic field. The first annealing operation may be performed prior to or after hard mask and photoresist formation. In one embodiment, the first annealing operation helps in orienting the pinning direction of one or more antiferromagnetic layers included in the stack layers. In such an example, the magnetic field provided during the first annealing operation is preferably directed in the desired direction of pinning of the antiferromagnetic material. In some embodiments, because the various layers within the stack have not yet been further defined, it may be possible to use higher temperatures during this initial annealing operation than those temperatures that may be used in subsequent annealing operations directed at correcting any magnetic defects resulting from device processing. Typical parameters for the first anneal in step 408 may include temperatures of 240 C-350 C for times of 30 minutes to 4 hours in the presence of a magnetic field of strength 5000 Oe or greater.

At 410, at least a first portion of the partially formed device is etched. The etching performed at 410 can include etching the upper layer of electrically conductive material to form a top electrode, etching at least one magnetic layer included in the magnetoresistive stack, and etching one or more dielectric layers in order to produce etched dielectric layers that may constitute a diffusion barrier or a tunnel junction. Following the etching performed at 410, surface treatment of the partially etched stack may occur to produce a treated partially etched stack. After treatment, the partially etched stack may be exposed to non-magnetizing gas or plasma to render any magnetic debris nonmagnetic.

At 412, a second annealing operation is performed in the presence of a second magnetic field. As discussed above, the second annealing operation may be performed after a partial etch of the stack or once the entirety of the magnetoresistive device has been formed. Prior to such a subsequent annealing operations, encapsulation of any susceptible layers may occur in order to ensure they are not degraded by the annealing process. As also discussed above, while the flow chart of FIG. 9 shows two annealing operations performed, additional annealing operations may occur during device processing. The second annealing operation performed at 412, when performed following definition of sensitive portions of the device (e.g. the tunnel barrier), may include annealing using a lower temperature. For example, a temperature under 300° C. may be appropriate in some embodiments, while in other embodiments a temperature within a range between 190° C. and 200° C. may be more appropriate. The temperature selected should coincide with achieving the goal of repairing magnetic defects while minimizing negative effects on other aspects of the magnetoresistive device. Moreover, the magnetic field applied during the second annealing step may be different than that applied during the first annealing step. For example, while the first annealing step may be directed at orienting antiferromagnetic or other fixed layers within the device structure, the second annealing step may apply a magnetic field along the easy access of a free layer within the device.

FIG. 10 illustrates a flow chart of a portion of the magnetoresistive device manufacturing process. At 502, an upper layer of electrically conductive material is etched to form a top electrode. As noted above, the top electrode can be formed using a number of different techniques. At 504, a spacer layer is etched to form an etched spacer layer included in the device stack. The spacer layer is located under the upper layer of electrically conductive material. At 506, a first dielectric layer is etched to form an etched first dielectric layer included in the device stack. In one embodiment, the first dielectric layer is located directly under and adjacent to the spacer layer etched at 504. In some embodiments, the first dielectric layer is used to form a diffusion barrier within the magnetoresistive device stack.

At 508, an upper magnetic layer is etched to form an upper magnetic portion of the device stack. The upper magnetic layer is under the first dielectric layer, and may include a plurality of sub-layers, including magnetic layers, nonmagnetic layers, coupling layers, etc. At 510, following the etching of the upper magnetic layer at 508, surface treatment of the partially etched magnetoresistive device stack is performed. As noted above, the surface treatment can include a reactive etch, sometimes referred to as backsputtering. As also noted above, the surface treatment, while intended to repair certain defects or damage resulting from previous etching steps, may itself result in additional magnetic debris.

At 512, the magnetic debris resulting from the surface treatment or other etching steps is exposed to non-magnetizing material. The non-magnetizing material may include non-magnetizing gas or plasma. As a result of the exposure, the magnetic debris is rendered nonmagnetic.

At 514, a second dielectric layer is etched to form a tunnel junction in the device stack. As noted above, prior to or after formation of the tunnel junction, encapsulation may be used to protect the sidewalls or other exposed portions of the layers. At 516, a lower magnetic layer is etched to form a lower magnetic portion of the device stack. As discussed above, the lower magnetic layer may include a number of sub-layers, for example those corresponding to a SAF structure. At 518, a lower layer of electrically conductive material is etched to form a bottom electrode.

At 520, material that encapsulates the device stack and the top and bottom electrodes is deposited. For example, hard mask material may be used to perform the encapsulation. Following encapsulation at 520, an annealing operation is performed at 522, where the annealing operation is performed in the presence of a magnetic field. In some embodiments, the magnetoresistive device stack includes a layer of antiferromagnetic material. In such embodiments, a pre-etch anneal operation performed prior to etching the upper magnetic layer may be used to help orient the magnetic field of the antiferromagnetic layer. In such instances the pre-etch magnetic field used in such a pre-etch anneal operation may be in a direction corresponding to a magnetization direction for the layer of antiferromagnetic material. In such embodiments, the magnetic field present in the annealing operation at 522 may be directed differently, as it is more concerned with correcting anomalies or defects produced during processing as opposed to providing an initial orientation for the antiferromagnetic layer.

As noted above, the annealing operation performed after completion of the device formation or after certain processing steps helps to improve the quality of certain device layers layers in terms of their magnetic characteristics. As magnetoresistive device structures continue to shrink in size, small imperfections or magnetic abnormalities can become more significant and have a greater impact on the switching characteristics of the magnetoresistive devices. As such, such a subsequent annealing steps that improve the magnetic characteristics of the devices can have a significant positive impact on device performance.

As also presented herein, combining annealing operations with exposure of residual magnetic debris to non-magnetizing materials can further help in optimizing magnetoresistive device performance. For example, by rendering debris nonmagnetic, variations in switching voltages corresponding to a plurality of magnetoresistive bits in a memory array can be reduced. Variations in the susceptibility of the free layer magnetic moments to undesired thermal disturbs can also be reduced. It should be appreciated that while presented as complementary, the annealing operations and de-magnetizing of the debris can be used independently as each presents beneficial results with or without the presence of the other.

Although the described exemplary embodiments disclosed herein are directed to various magnetoresistive-based devices and methods for making same, the present disclosure is not necessarily limited to the exemplary embodiments, which illustrate inventive aspects that are applicable to a wide variety of semiconductor processes and/or devices. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method of manufacturing a magnetoresistive based device, comprising:
   depositing a lower layer of electrically conductive material on a substrate;
   depositing a plurality of stack layers corresponding to a magnetoresistive stack on the lower layer of electrically conductive material, wherein the plurality of stack layers includes layers of magnetic material and at least one dielectric layer corresponding to a tunnel junction;
   depositing an upper layer of electrically conductive material on the plurality of stack layers to form a partially formed device;
   performing a first annealing operation with respect to the partially formed device, wherein the first anneal operation is performed in the presence of a first magnetic field;
   etching at least a first portion of the partially formed device to form an etched partially formed device; and
   performing a second annealing operation with respect to the etched partially formed device, wherein the second anneal operation is performed in the presence of a second magnetic field.

2. The method of claim 1, wherein etching at least a first portion of the partially formed device includes:
   etching the upper layer of electrically conductive material to form a top electrode; and
   etching at least one magnetic layer included in the magnetoresistive stack to produce a partially etched stack.

3. The method of claim 2 further comprising:
   after etching at least one magnetic layer included in the magnetoresistive stack:
   performing a surface treatment of the partially etched stack to produce a treated partially etched stack;
   exposing the treated partially etched stack to at least one of gas and plasma that renders residual material non-magnetic;
   after exposing the partially etched stack, encapsulating the partially etched stack; and
   etching the lower layer of electrically conductive material to form a bottom electrode, wherein the second annealing operation is performed after encapsulating.

4. The method of claim 3 further includes:
   after etching the at least one magnetic layer and prior to exposing the partially etched stack to one of non-magnetizing gas and non-magnetizing plasma, etching a dielectric layer included in the magnetoresistive stack to form an etched dielectric layer included in the magnetoresistive device stack.

5. The method of claim 3 further comprising performing a third anneal operation after etching the lower layer of electrically conductive material.

6. The method of claim 1 further comprising etching the lower layer of electrically conductive material to form a bottom electrode, wherein the second annealing operation is performed after etching the lower layer of electrically conductive material.

7. The method of claim 1, wherein performing the second annealing operation includes performing the second annealing operation using a lower temperature than a higher temperature used during the first annealing process.

8. The method of claim 7, wherein the lower temperature is less than 300 degrees Celsius.

9. The method of claim 7, wherein the lower temperature is less than 200 degrees Celsius.

10. The method of claim 1, wherein the first magnetic field is in a different direction than the second magnetic field.

11. The method of claim 10, wherein the second magnetic field is in a direction corresponding to an easy axis of a free layer included in the magnetoresistive stack.

12. The method of claim 11, wherein magnetoresistive stack includes a layer of antiferromagnetic material, and wherein the first magnetic field is in a direction corresponding to a magnetization direction for the layer of antiferromagnetic material.

13. A method of manufacturing a magnetoresistive based device, comprising:
    etching an upper layer of electrically conductive material to form a top electrode;
    etching an upper magnetic layer under the upper layer of electrically conductive material to form an upper magnetic portion of a magnetoresistive device stack;
    etching a first dielectric layer under the upper magnetic layer to form a tunnel junction included in the magnetoresistive device stack;
    etching a bottom magnetic layer under the first dielectric layer to form a bottom magnetic portion of the magnetoresistive device stack;
    etching a lower layer of electrically conductive material to form a bottom electrode;
    encapsulating sidewalls of at least a portion of the magnetoresistive device stack; and
    after encapsulating, performing an annealing operation in the presence of a magnetic field.

14. The method of claim 13, wherein encapsulating sidewalls further comprises depositing a hard mask layer that encapsulates the magnetoresistive device stack.

15. The method of claim 13 further comprising rendering magnetic debris non-magnetic prior to encapsulating.

16. The method of claim 15 further comprising performing surface treatment after etching the upper magnetic layer and before rendering magnetic debris non-magnetic.

17. The method of claim 15 further comprising:
    etching a spacer layer under the upper layer of electrically conductive material to form an etched spacer layer included in the magnetoresistive device stack; and
    etching a second dielectric layer under the spacer layer to form an etched second dielectric layer included in the magnetoresistive device stack.

18. A method of manufacturing a magnetoresistive based device, comprising:
    etching an upper layer of electrically conductive material to form a top electrode;
    etching a spacer layer under the upper layer of electrically conductive material to form an etched spacer layer included in a magnetoresistive device stack;
    etching a first dielectric layer under the spacer layer to form an etched first dielectric layer included in the magnetoresistive device stack;
    etching an upper magnetic layer under the first dielectric layer to form an upper magnetic portion of the magnetoresistive device stack;
    performing surface treatment after etching the upper magnetic layer, the surface treatment resulting in magnetic debris;
    rendering magnetic debris non-magnetic by exposing the magnetic debris to non-magnetizing material;
    etching a second dielectric layer under the upper magnetic layer to form a tunnel junction included in the magnetoresistive device stack;
    etching a bottom magnetic layer under the second dielectric layer to form a bottom magnetic portion of the magnetoresistive device stack; and
    etching a lower layer of electrically conductive material to form a bottom electrode.

19. The method of claim 18, further comprising:
    depositing material that encapsulates the magnetoresistive device stack, the top electrode, and the bottom electrode; and
    after depositing the material, performing an annealing operation in the presence of a magnetic field.

20. The method of claim 19 further comprises:
    performing a pre-etch anneal operation prior to etching the upper magnetic layer, the pre-etch anneal operation performed in the presence of a pre-etch magnetic field; and
    etching a layer of antiferromagnetic material after the pre-etch anneal operation to form an etched antiferromagnetic portion of the magnetoresistive device stack, wherein the pre-etch magnetic field is in a direction corresponding to a magnetization direction for the layer of antiferromagnetic material.

21. The method of claim 18, wherein rendering the magnetic debris non-magnetic further comprises exposing the magnetic debris to at least one of a non-magnetizing gas and a non-magnetizing plasma that renders the magnetic debris non-magnetic.

* * * * *